SOLID STATE ELECTRONIC TIMER DELAY SWITCH WITH VARIABLE TIME DELAY
Filed Nov. 9, 1966
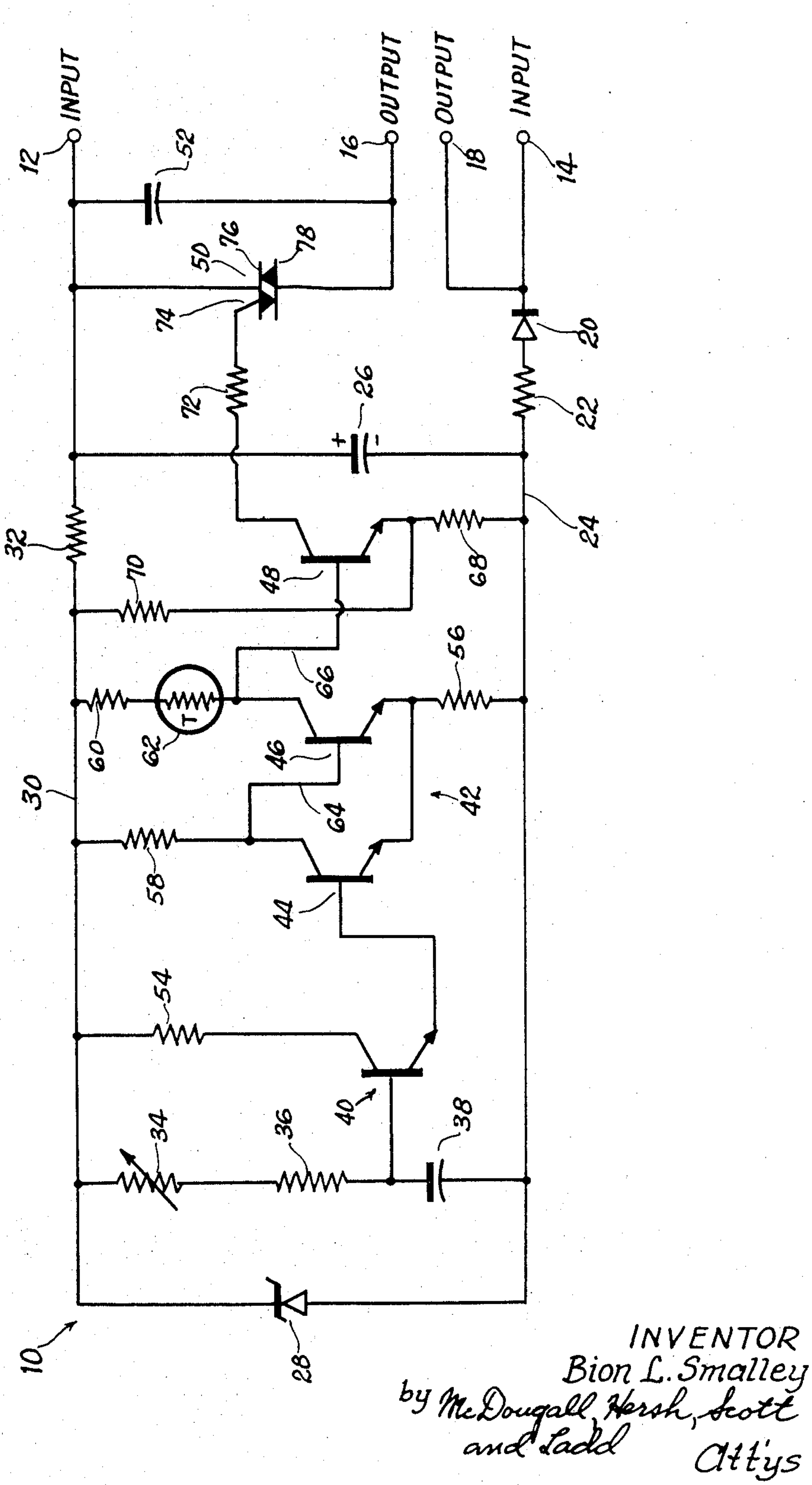
INVENTOR
Bion L. Smalley
by McDougall, Hersh, Scott and Ladd
Att'ys

United States Patent Office 3,473,107

Patented Oct. 14, 1969

3,473,107

SOLID STATE ELECTRONIC TIMER DELAY SWITCH WITH VARIABLE TIME DELAY

Bion L. Smalley, Chicago, Ill., assignor to Intercontinental Dynamics Corporation, Chicago, Ill., a corporation of Illinois Filed Nov. 9, 1966, Ser. No. 593,161

Int. Cl. G05f *1/40*

U.S. Cl. 323—22 1 Claim

ABSTRACT OF THE DISCLOSURE

A Triac solid state electronic switching device for alternating current is connected between input and output circuits. A regulated direct voltage is derived from the input circuit by a rectifier, a filtering capacitor, a series resistor and a Zener diode. A timing capacitor is charged from the regulated voltage through a variable timing resistor. An isolating transistor is connected between the timing capacitor and the first transistor in a two-transistor trigger circuit. When the timing capacitor is charged to a sufficient voltage, the isolating transistor and the first transistor become conductive, whereupon the second transistor of the trigger circuit becomes nonconductive in an abrupt manner. An output transistor renders the Triac device conductive when the second transistor becomes nonconductive.

This invention relates to electronic timers and pertains particularly to solid state electronic timers.

One object of the present invention is to provide a new and improved timer which is entirely electronic, in that all mechanical relays or the like are dispensed with, and which is entirely solid state, in that solid state electronic components are employed to the exclusion of vacuum tubes and the like.

A further object is to provide a new and improved electronic timer of the foregoing character which operates with an alternating current input and delivers an alternating current output.

Another object is to provide a new and improved electronic timer which affords a controlled and variable time delay between the application of the alternating current input and the development of the alternating current output.

A further object is to provide a new and improved electronic timer which is especially well adapted for producing a controlled and variable time delay between the application of alternating current to the input of the timer and the energization of a solenoid valve or some other similar device connected to the output of the timer.

Another object is to provide such a new and improved electronic timer which is effective and dependable, yet extremely compact and remarkably low in cost.

Further objects and advantages of the present invention will appear from the following description, taken with the accompanying drawing, in which the single figure is a schematic wiring diagram of a solid state electronic timer to be described as an illustrative embodiment of the present invention.

Thus, the drawing illustrates a transistorized or solid state electronic timer 10 having a pair of input terminals 12 and 14 and a pair of output terminals 16 and 18. It will be seen that the output terminal 18 is connected directly to the input terminal 14. The purpose of the illustrated timer is to provide a controlled and variable time delay between the application of alternating current to the input terminals 12 and 14, and the development of alternating current at the output terminals 16 and 18. The alternating current input may be at 110 volts and 60 cycles or any other suitable voltage and frequency.

The timer 10 acts as an electronic switch to connect the alternating current to the output terminals 16 and 18 after a controlled time delay.

The timer 10 is operated in part on the alternating current input, and in part on direct current which is derived from the alternating current input. Thus, the timer 10 comprises a diode 20 which is employed to rectify the alternating current. In this case, one side of the diode 20 is connected to the input terminal 14. The other side of the diode 20 is connected through a filtering and voltage dropping resistor 22 to a lead 24 which serves as a negative terminal of the direct current power supply. The input terminal 12 serves as the positive terminal of the direct current power supply. A filtering capacitor 26 is connected between the input terminal 12 and the lead 24.

The illustrated timer 10 employs a Zener diode 28 to regulate or stabilize the direct voltage produced by the diode 20. As shown, one side of the Zener diode 28 is connected directly to the negative power supply lead 24. The other side of the diode 28 is connected through a lead 30 and a voltage dropping resistor 32 to the input terminal 12. Due to the regulating action of the Zener diode 28, a stabilized direct voltage is produced between the positive lead 30 and the negative lead 24.

The filtering resistor 22 and the filtering capacitor 26 produce a small time delay, on the order of a fraction of a second, between the application of the alternating current to the input currents 12 and 14 and the development of the stabilized direct voltage between the leads 24 and 30. However, the timer is provided with additional time delay components for producing the major portion of the delay of which the timer is capable. As shown, these time delay components comprise a variable resistor 34, a fixed resistor 36, and a capacitor 38, all connected in series between the positive lead 30 and the negative lead 24. It will be understood that the capacitor 38 is adapted to be charged through the resistors 34 and 36. The rate at which the capacitor is charged is determined by the setting of the variable resistor 34. The timer is adapted to be operated in response to the developmnet of a predetermined voltage across the capacitor 38.

In order to avoid taking any substantial current from the capacitor 38, an isolating transistor 40 is preferably employed to receive the voltage from the capacitor 38. The transistor 40 drives a trigger circuit 42 comprising two transistors 44 and 46 and allied components 56, 58, 60 and 62. The output of the trigger circuit 42 is amplified by another transistor 48 which is employed to drive a Triac solid state switch 50. It will be seen that the main terminals of the Triac 50 are connected to the input terminal 12 and the output terminal 16. Thus, the Triac 50 controls the application of the alternating current to the output terminals 16 and 18. A capacitor 52 of small value is preferably connected across the Triac 50 to limit the magnitude and rate of spikes and other switching transients, which might erroneously trigger the Triac 50.

Returning to the isolating or amplifying transistor 40, it will be seen that the base of the transistor 40 is connected to the positive terminal of the capacitor 38, to which the series combination of resistors 34 and 36 is also connected. A current limiting resistor 54 is connected between the positive power supply lead 30 and the collector of the transistor 40.

The emitter of the transistor 40 is connected directly to the base of the transistor 44, so that the output current of the transisor 40 becomes the input current of the transistor 44. The trigger circuit 42 is of the type in which the emitters of the transistors 44 and 46 are connected through a common biasing resistor 56 to the negative lead 24. The resistor 56 provides mutual coupling between the transistors 44 and 46.

A load resistor 58 is connected between the positive lead 30 and the collector of the transistor 44. Similarly, a load resistor 60 and a thermistor 62 are connected in series between the positive lead 30 and the collector of the transistor 46. A lead 64 provides direct coupling between the collector of the transistor 44 and the base of the transistor 46.

Initially, the transistors 40 and 44 are non-conductive, while the transistor 46 is conductive. The development of the voltage across the capacitor 38 causes the transistor 40 to become conductive. As a result, the transistor 44 abruptly becomes conductive, while the transistor 46 abruptly becomes non-conductive.

It will be seen that a lead 66 provides direct coupling between the collector of the transistor 46 and the base of the transistor 48. Initially, the transistor 48 is biased to a non-conductive state by resistors 68 and 70. The resistor 68 is connected between the emitter of the transistor 48 and the negative lead 24. The resistor 70 is connected between the positive lead 30 and the emitter of the transistor 48. Thus, the resistor 70 bleeds current through the resistor 68.

A coupling resistor 72 is connected directly between the collector of the transistor 48 and the control electrode 74 of the Triac 50. As already indicated, the main electrodes 76 and 78 of the Triac 50 are connected to the input terminal 12 and the output terminal 16. Due to the direct connection of the coupling resistor 72, the input current to the Triac 50 is the same as the output current of the transistor 48. When the transistor becomes conductive, the Triac 50 becomes conductive so that alterating current is supplied between the output terminals 16 and 18.

SUMMARY OF OPERATION

While the operation of the timer has already been described, it may be helpful to offer a brief summary. At the beginning of the cycle of the timer, alternating current is applied between the input terminals 12 and 14. The alternating current is rectified by the diode 20 so that a direct voltage appears across the filtering capacitor 26. A regulated direct voltage of somewhat lower value appears across the Zener diode 28. This direct voltage is employed to operate the transistors 40, 44, 46 and 48. The transistor 46 becomes conductive, while the transistors 40, 44 and 48 are initially non-conductive. The Triac 50 is initially non-conductive.

The regulated direct voltage between the leads 24 and 30 causes the charging of the capacitor 38 through the variable resistor 34 and the fixed resistor 36. The resistor 34 may be varied so as to change the time required to charge the capacitor 38 to the requisite value which causes the operation of the timer. When the requisite value is reached, the isolating and amplifying transistor 40 becomes conductive and supplies current to the input transistor 44 of the trigger circuit 42. As a result, the transistor 44 becomes abruptly conductive, while the output transistor 46 of the trigger circuit becomes abruptly non-conductive. The resulting voltage increase from the trigger circuit causes the transistor 48 to become conductive, so that the Triac 50 becomes conductive. The Triac 50 thereupon conducts the alternating current in both directions between the input terminal 12 and the output terminal 16. When the alternating current is removed from the input terminals 12 and 14, it is no longer available to be supplied to the output terminals 16 and 18. The capacitors become discharged and all of the transistors become non-conductive. Thus, the timer is ready for a new cycle of operation.

By varying the value of the variable resistor 34, the time delay may be changed between a minimum of a fraction of a second and a maximum of quite a number of seconds. Thus, the timer provides a variable time delay over a wide range.

The electronic timer has no moving parts and is extremely compact. Moreover, it may be made at low cost.

As in the case of other electronic devices, the values of the components are subject to considerable variation.

While those skilled in the art will be able to select appropriate values, it is believed that it will be helpful to provide the following table, which gives one set of appropriate values, by way of illustration:

| Resistors: | Values in Ohms |
|---|---|
| 22 | 3.3K |
| 32 | 120 |
| 34 (megohm variable) | 10 |
| 36 | 100K |
| 54 | 330K |
| 56 | 5.1K |
| 58 | 24K |
| 60 | 7.5K |
| 62 (thermistor) | 1K |
| 68 | 1.2K |
| 70 | 1K |
| 72 | 560 |
| Capacitors: | Mfd. |
| 26 | 50 |
| 38 | 2 |
| 52 | .01 |

SOLID STATE ELECTRONICS

| | |
|---|---|
| 20 | Diode rectifier |
| 28 | Zener diode—16 v., 1 watt |
| 40 | Transistor type—2N3711 |
| 44 | Transistor type—2N3394 |
| 46 | Transistor type—2N3394 |
| 48 | Transistor type—2N3394 |
| 50 | Triac type—RCA TA2893 |

I claim:

1. An electronic time delay switch, comprising the combination of an input circuit for receiving alternating current, an output circuit for delivering alternating current, a Triac solid state eelctronic switching device having its main terminals connected between said input and output circuits, a rectifier connected to said input circuit for deriving a direct voltage therefrom, a filtering capacitor connected to said rectifier for smoothing said direct voltage, a series resistor and a Zener diode connected to said filtering capacitor to provide a regulated direct voltage across said Zener diode, a timing capacitor, a manually variable timing resistor connected between said Zener diode and said timing capacitor for charging said timing capacitor from said regulated direct voltage, said Triac solid state electronic switching device having a gate for controlling the conduction between said main terminals thereof, and an amplifying circuit connected between said timing capacitor and said gate for providing a signal at said gate to render said Triac solid state electronic switching device conductive between said main terminals in response to the charging of said timing capacitor to a predetermined voltage, whereby the alternating current will be supplied to said output circuit after a time delay from the energization of said input circuit, said variable timing resistor being operable to vary said time delay, said amplifying circuit comprising an electronic trigger device including first and second transistors with mutual coupling means therebetween producing an initial state in which said second transistor is conductive and a changed state in which the conduction is abruptly shifted to said first transistor, a first transistor amplifier connected between said timing capacitor and said first transistor of said trigger device for shifting said trigger device to said changed state when said timing capacitor is charged to said predetermined voltage, and a second transistor amplifier connected between said second transistor of said trigger device and said gate for producing an enabling signal to said gate when said trigger device is shifted to said changed state.

References Cited

UNITED STATES PATENTS

| | | |
|---|---|---|
| 3,243,711 | 3/1966 | King et al. |
| 3,320,437 | 5/1967 | Myers. |
| 3,335,291 | 8/1967 | Gutzwiller. |
| 3,346,874 | 10/1967 | Howell. |

| | | |
|---|---|---|
| 3,353,029 | 11/1967 | Rolfes. |
| 3,372,328 | 3/1968 | Pinckaers ---------- 323—24 X |

OTHER REFERENCES

Petersen, "Temperature Control Circuit," IBM Technical Disclosure Bulletin, vol. 8, No. 5, October 1965, pp. 808, 809.

JOHN F. COUCH, Primary Examiner

A. D. PELLINEN, Assistant Examiner

U.S. Cl. X.R.

324—24, 38